United States Patent
Murakami et al.

(10) Patent No.: US 6,169,032 B1
(45) Date of Patent: Jan. 2, 2001

(54) CVD FILM FORMATION METHOD

(75) Inventors: Seishi Murakami; Tatsuo Hatano, both of Yamanashi-ken (JP)

(73) Assignee: Tokyo Electron Limited, Tokyo (JP)

(*) Notice: Under 35 U.S.C. 154(b), the term of this patent shall be extended for 0 days.

(21) Appl. No.: 09/102,911

(22) Filed: Jun. 23, 1998

(30) Foreign Application Priority Data

Jun. 23, 1997 (JP) .................................................. 9-180248

(51) Int. Cl.[7] .................................................. H01L 21/44
(52) U.S. Cl. .................. 438/683; 438/660; 438/680; 427/314; 427/372.2
(58) Field of Search .................................. 438/683, 680, 438/676, 660, 681, 913, 935; 427/314, 372.2

(56) References Cited

U.S. PATENT DOCUMENTS 5,574,247 * 11/1996 Nishitani et al. ..................... 118/708
6,080,444 *  6/2000 Shimizu et al. .................. 427/248.1

* cited by examiner

*Primary Examiner*—Caridad Everhart
(74) *Attorney, Agent, or Firm*—Oblon, Spivak, McClelland, Maier & Neustadt, P.C.

(57) ABSTRACT

The present invention provides an apparatus and method for forming a film by loading an object to be processed into a process chamber, moving up supporting pins to receive the susceptor, heating the object to be processed with heat radiation for a predetermined time by means of a heater housed in the susceptor while the supporting pins is being moved up, mounting the object to be processed on the susceptor, introducing arbitrarily chosen gases to adjust an inner pressure and temperature in accordance with the film formation conditions, and introducing a raw material gas into the process chamber, thereby starting film formation. After completion of the film-formation, only the supply of the raw material gas is stopped, whereas supply of other gases is gradually stopped. When the object to be processed is unloaded from the process chamber after completion of the film formation process, first, supporting pins are moved up to move the object to be processed away from the heater housed in the susceptor. The object to be processed is cooled in this manner. By virtue of a series of operations, a rapid change temperature and, a rapid change in pressure applied to the object to be processed is avoided, resulting in preventing a rapid temperature change.

10 Claims, 6 Drawing Sheets

CVD FILM FORMATION METHOD

BACKGROUND OF THE INVENTION

1. Field of the Invention

The present invention relates to a CVD film formation method for forming a metal film such as a Ti (titanium) film or a TiN (titanium nitride) film on a semiconductor substrate placed in a raw-material gas atmosphere.

2. Discussion of the Background

A semiconductor device is generally constructed by forming a circuit device on a semiconductor substrate made of silicon (hereinafter, referred to as a "semiconductor wafer"), forming a contact hole for connecting the circuit device to a metal wiring or a via hole for connecting the metal wirings to each other via an interlevel dielectric film, and burying these holes with a buried layer made of metal.

Prior to the formation of the buried layer, a barrier layer is formed in order to prevent impurities and silicon from being diffused. The barrier layer is formed at least on the interlevel dielectric film of the wall of the contact hole and on the terminal surface of the circuit element (serving as a connecting surface) and usually consists of two-layer metallic thin films such as a Ti film and a TiN film.

Up to now, the barrier layer of this type has been formed by a physical vapor deposition (PVD) method. However, with increasing demands for miniaturization and high integration of the device, the design rule thereof has become strict. In other words, wiring and holes have to be reduced in width and aperture and formed with a high aspect ratio.

Therefore, it has been difficult to form the barrier layer made of a Ti film or a TiN film on the bottom of holes by the conventionally-used PVD method.

In place of the PVD method, a CVD (Chemical Vapor Deposition) method has been employed for forming an appropriate barrier layer and the buried layer.

For example, in the case where the Ti film is formed by using the CVD method, use is made of a raw material gas mixture containing $TiCl_4$ (titanium tetrachloride) gas and $H_2$ (hydrogen) gas. In the case where the TiN film is formed, use is made of a raw material gas mixture containing $TiCl_4$ gas and either $NH_3$ (ammonia) gas or MMH (monomethylhydrazine) gas.

However, the film-formation process employing a conventional CVD method includes rapid heating and cooling steps of a semiconductor wafer. Consequently, high stress is applied to the film, with the result that crystal defect and distortion of the semiconductor wafer due to the stress take place after the film formation.

When the semiconductor wafer is distorted, cracks occur in the film. The center portion and the peripheral portion of the semiconductor wafer are not brought into the same focus in a light exposure device in a photolithographic step. When the cracks are formed in the formed film, a conductive failure takes place. In addition, the exposed underlying film due to the cracks is etched in the etching step.

BRIEF SUMMARY of THE INVENTION

An object of the present invention is to provide a CVD film-formation method free from cracks by preventing crystal defect and distortion of an object to be processed (a semiconductor wafer) while minimizing stress to be applied to the film formed on a semiconductor wafer.

To attain the objects of the present invention, there is provided a method of forming a thin film on an object to be processed placed in a reduced process chamber, by chemical Vapor Deposition (CVD), comprising the steps of:

introducing arbitrarily chosen gases into the process chamber having an object to be processed loaded therein before a raw material gas is introduced, to set an inner pressure to a film-formation pressure determined in accordance with film-formation conditions;

introducing the raw material gas for use in film formation into the process chamber;

performing the film formation for a predetermined time determined in accordance with the film-formation conditions; and terminating only a raw material gas supply, followed by terminating a supply of the arbitrarily chosen gases while flow rates thereof are gradually reduced, after completion of film formation process, thereby preventing a rapid pressure change of the process chamber and preventing a rapid temperature change of the semiconductor substrate due to the rapid pressure change.

The present invention also provides a method of forming a thin film on an object to be processed placed in a reduced process chamber by CVD (Chemical Vapor Deposition) while heating the object to be processed mounted on a susceptor by a heater housed in the susceptor, which comprises the steps of:

loading the object to be processed into the process chamber;

placing an object to be processed near the susceptor to heat the object to be processed with heat radiation from the heater for an appropriate time before the object to be processed is directly heated;

mounting the object to be processed onto the susceptor and heating the object to be processed by the heater;

forming a film on the object to be processed by CVD;

moving the object to be processed away from the heater and placing the object to be processed near the heater for an appropriate time to reduce the temperature of the object to be processed; and unloading the object to be processed from the process chamber, thereby preventing a rapid temperature change of the object to be processed.

According to the present invention described in the foregoing, to load the object to be processed (the semiconductor wafer) into the process chamber from the transfer chamber, the supporting pins are first moved up and the semiconductor substrate is mounted thereon. While the supporting pins are maintained as they are, the semiconductor wafer is heated with heat radiation from the heater housed in the susceptor. After the temperature of the semiconductor wafer is thus increased to some extent, the semiconductor wafer is mounted on the susceptor and then heated until the temperature reaches a film-formation temperature determined in accordance with film-formation conditions. In this manner, it is possible to prevent rapid temperature change of the semiconductor wafer. To unload the semiconductor substrate from the process chamber after completion of the film-formation process, the supporting pins are first moved up to keep the semiconductor wafer away from the susceptor. In this way, direct heating of the semiconductor wafer by the heater is stopped. After the temperature of the semiconductor wafer decreases to some degree, the semiconductor wafer is unloaded and moved into the transfer chamber having a low temperature atmosphere. It is therefore possible to prevent a rapid temperature change of the semiconductor wafer in the cooling step.

To initiate the film formation on the semiconductor wafer, arbitrarily chosen gases are introduced into the process chamber, thereby adjusting the pressure to a film-formation pressure determined in accordance with the film formation conditions before the raw material gas is introduced. It is therefore possible to suppress a rapid pressure change accompanying the rapid temperature change in the process chamber. After the film-formation process is completed, only the supply of the raw material gas is terminated, and the supply of the other gases is gradually terminated. In this manner, it is possible to suppress a rapid pressure change accompanying the temperature change in the process chamber.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention, in which.

DETAILED DESCRIPTION OF THE PREFERRED EMBODIMENT

Now, embodiments of the present invention will be explained with reference to the accompanying drawings.

Figure 1:
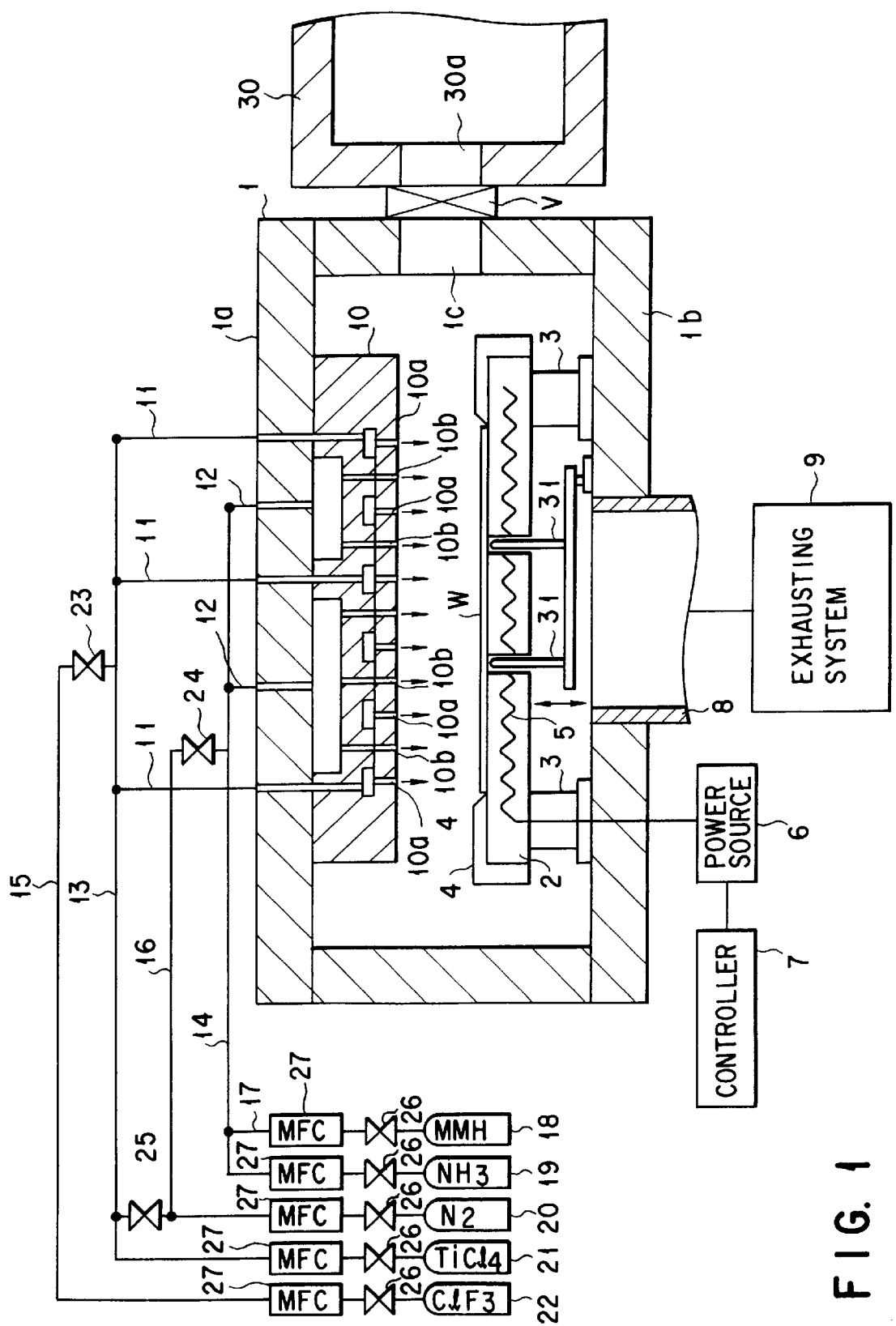
FIG. 1 is a view showing a structure of a CVD apparatus for carrying out a CVD film formation according to the present invention.

FIG. 1 is a cross-sectional view showing a TiN film formation apparatus for carrying out a CVD film formation according to the present invention.

The film formation apparatus comprises at least one process chamber 1 capable of maintaining a vacuum condition. The process chamber 1 has a susceptor 2 housed therein. The susceptor 2 holds an object to be processed such as a semiconductor wafer W, horizontally. The susceptor 2 is supported by a supporting portion 3 fixed at the inner bottom of the process chamber 1.

A guide ring 4 is formed in the periphery of the susceptor 2. The guide ring 4 is responsible for guiding the semiconductor wafer W and positioning it at a predetermined position. A heater 5 is embedded inside the susceptor 2 and plays a role in heating the semiconductor wafer W. The heater 5 is connected to a power source 6, which is controlled by a controller 7. The temperature of the heater 5 is controlled in accordance with a detection signal of a temperature sensor (not shown) provided in the process chamber 1.

A loading port 1c for loading the semiconductor wafer W is formed on a side wall of the process chamber 1. The process chamber 1 is connected to the loading port 30a of the transfer chamber 30 by way of the gate valve V provided at the loading port 1c. The loading port 30a can be communicated with the loading port 1c by operating (opening) the gate valve V. The semiconductor wafer W is held by means of a transfer arm-like wafer transporting mechanism (not shown) provided in the transfer chamber 30 and taken out from a wafer cassette stored in a loadlock/unloadlock chamber (not shown) via the transfer chamber 30 into the process chamber 1. After completion of the film-formation process, the semiconductor wafer W is unloaded from the process chamber 1 by the wafer transporting mechanism and either returned to the wafer cassette or loaded into another process chamber.

The susceptor 2 has a plurality of movable supporting pins 31 for holding the semiconductor wafer W above the susceptor 2. When the semiconductor wafer W is loaded/unloaded, the wafer supporting pins 31 are moved up and the semiconductor wafer W is transferred onto the wafer supporting pins 31.

The wafer supporting pins 31 are moved up and down by a driving means (not shown). The driving means is controlled by a control means (not shown). The control means is connected not only to the driving means for the wafer supporting pins but also to driving sections of the gate valve V, the transfer arm, and valves 23, 24, 25, and 26. These valves are sequentially driven by the control means in embodiments of the present invention.

The ceiling 1a of the process chamber 1 has a shower head 10 for introducing a raw material gas into the process chamber 1. The shower head 10 according to this embodiment employs a raw-material gas supply system called a post mix system. In the post mix system, gas introducing passages for two supply systems are formed independently so as not with be mixed to each other in the passage.

In the shower head 10, each pipe of the two gas supply systems starting from a single gas inlet is branched into a plurality of gas passages and led into numeral gas exhausting holes 10a (or 10b) for supplying a raw material gas (including a cleaning gas and a carrier gas). These gas exhausting holes 10a and 10b are arranged alternately in the form of a matrix.

To these gas inlets, two independent gas supply systems are connected respectively. A gas from either a $TiCl_4$ gas source 21 or a $ClF_3$ gas source 22 is supplied and released from the exhausting hole 10a. A gas from either an MMH gas source 18 or a $NH_3$ gas source 19 is released from the exhausting hole 10b. Furthermore, the gas supply passage from a $N_2$ gas source 20 is connected to each of the gas supply systems via valves 24 and 25.

Each of the branched gas pipes 11 has one end which is connected to a gas inlet for the passage connecting the gas exhausting hole 10a. The other end is connected to a pipe 13. The pipe 13 is connected to the $TiCl_4$ gas source 21 (e.g., a gas cylinder) via a mass flow controller (MFC) 27

(responsible for controlling a gas flow rate) and a valve 26. A pipe 15 is branched from the pipe 13 via a valve 23. The pipe 15 is connected to a source 22 for the ClF₃ gas serving as a cleaning gas via the MFC 27 and the valve 26.

Each of the branched pipes 12 has one end connected to the gas inlet for the passage connecting to the gas exhausting holes 10b. The other end is connected to a pipe 14 which is connected to a NH₃ gas source 19 (e.g., a gas cylincer) via an MFC 27 and a valve 26. A pipe 17 is branched from the pipe 14 and connected to a MMH gas source 18 via the MFC 27 and the valve 26.

The N₂ gas source 20 is connected to a pipe 16 via the valve 26 and the MFC 27. The pipe 16 is connected to the pipe 13 via a valve 25 and connected to a pipe 14 via a valve 24. It is possible to supply N₂ gas to the pipes 13 and 14 by switching operation of valves 24 and 25.

An exhausting port 8 is formed in the bottom portion 1b of the process chamber 1 and connected to an exhausting system 9. The process chamber 1 is vacuumed by a vacuum pump of the exhausting system 9 to obtain a desired degree of vacuum or a predetermined pressure.

Figure 2:
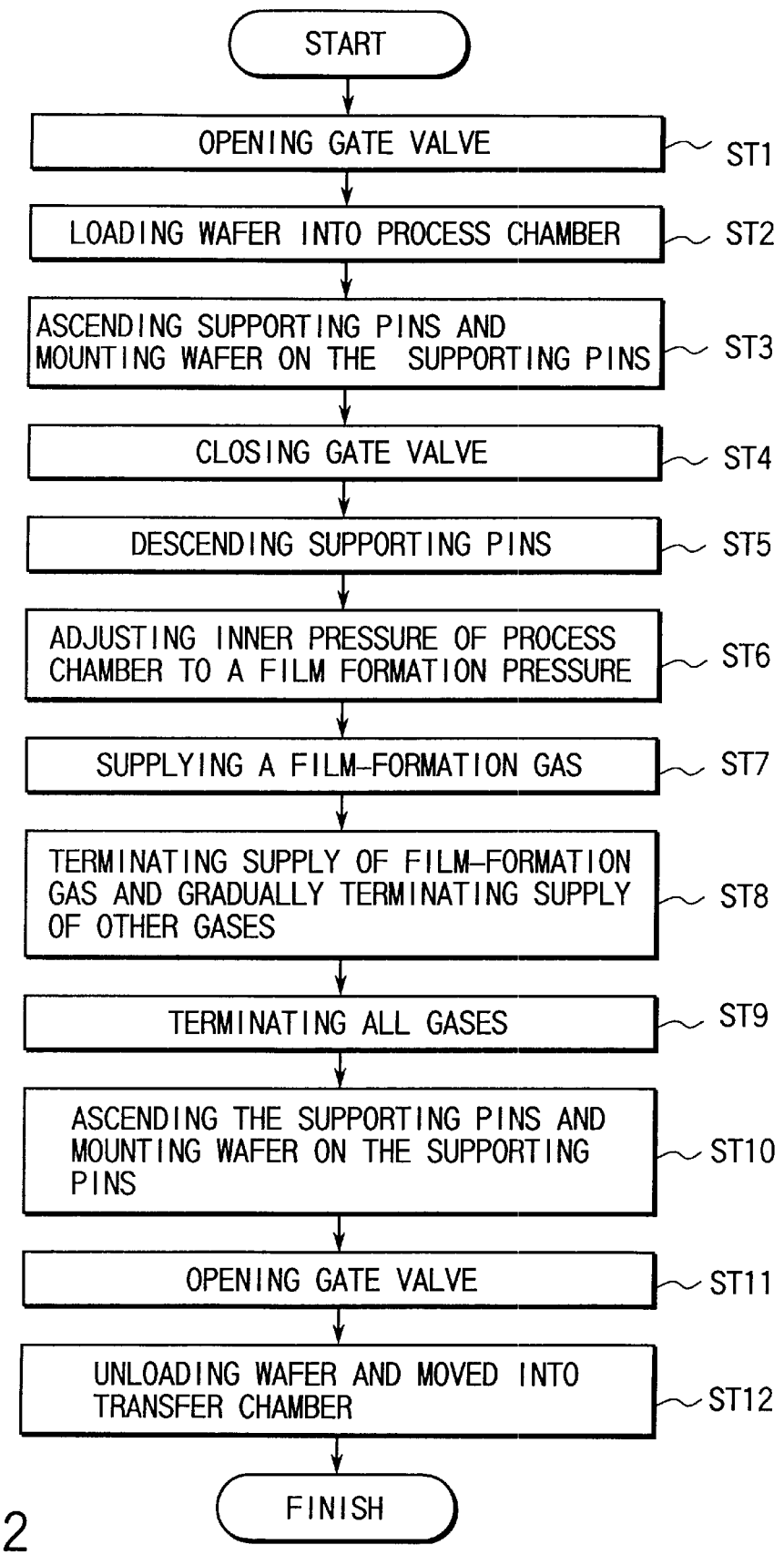
FIG. 2 is a flowchart for explaining the steps of a CVD film formation method according to an embodiment of the present invention.

Next, the CVD film-formation method of the present invention will be explained with reference to the flowchart shown in FIG. 2. In this embodiment, we will explain the case where a TiN film is formed.

First, the gate valve V interposed between the transfer chamber 30 and the process chamber 1 is opened (Step ST 1). Note that the transfer chamber 30 is previously reduced in pressure to the same degree of vacuum as that of the process chamber 1. Second, the semiconductor wafer W is taken out from the wafer cassette housed in, e.g., the loadlock chamber, by the wafer transporting mechanism (not shown), passed through the gate valve 30 opened, and transported to a space above the susceptor 2 of the process chamber 1 (Step ST2).

Thereafter, the supporting pins 31 provided in the susceptor 2 are moved upward and receive the semiconductor wafer W from the wafer transporting mechanism. Subsequently, the supporting pins are maintained in the upward position while holding the semiconductor wafer W thereon (Step ST3). After the wafer transporting mechanism is moved back to the transfer chamber 30, the gate valve V is closed (Step ST4).

After the supporting pins 31 are held at the upward position for a predetermined time, e.g., 1 to 60 seconds, more preferably 2 to 10 seconds, they are moved down. In this manner, the semiconductor wafer W is mounted on the susceptor 2 (Step ST 5). Since the susceptor 2 has been heated by means of the heater 5 by this time, the semiconductor wafer W is heated to e.g., 450 to 600° C., upon mounting on the susceptor 2.

In this case, since the semiconductor wafer W is slowly heated by heat radiation while the semiconductor wafer W is placed upon the supporting pins 31, the semiconductor wafer W is increased in temperature to some extent.

Thereafter, a film formation process is initiated by operating the valve 26 and the MFC 27.

First, N₂ gas and NH₃ gas are introduced at a predetermined flow-rates into the process chamber 1. For example, the ratio of N₂ gas: NH₃ gas is set within the range of 50–500: 200–400 (SCCM). Thereafter, pressure of the process chamber 1 is adjusted to a film-formation pressure, e.g., 1 Torr. Then, pre-annealing is performed (Step ST6).

Second, while the flow rates of N₂ gas and NH₃ gas are maintained, TiCl₄ is pre-flowed at a flow rate of 5–20 SCCM for about 5–20 seconds. Subsequently, a TiN film formation step is carried out under the same conditions for a predetermined time (Step ST7). At this time, NH₃ gas may be used together with MMH gas.

After the film formation is performed for a predetermined time, the TiCl₄ gas supply is terminated and other gases are gradually terminated (ST 8). After a predetermined time, all gas supply is completely terminated (Step ST 9). The film formation step is thus completed.

After completion of the film formation process, the supporting pins 31 are moved up. The semiconductor wafer W is kept away from the heated surface of the susceptor 2 and maintained as it is for a predetermined time, e.g, 1 to 60 seconds, more preferably, 2 to 10 seconds (Step ST 10). In this way, the temperature of the semiconductor wafer W is reduced to some extent.

Thereafter, the gate valve V is opened (ST 11), and the wafer transporting mechanism is moved from the transfer chamber 31 to the upper space of the susceptor 2. The semiconductor wafer W is passed to the wafer transporting mechanism by moving the supporting pins 31 downwards.

Then, the semiconductor wafer W is unloaded from the process chamber 1 by moving back the wafer transporting mechanism to the transfer chamber 30 (ST12). Thereafter, the semiconductor wafer is transported into the wafer cassette or another process chamber as described previously.

Figure 3A:
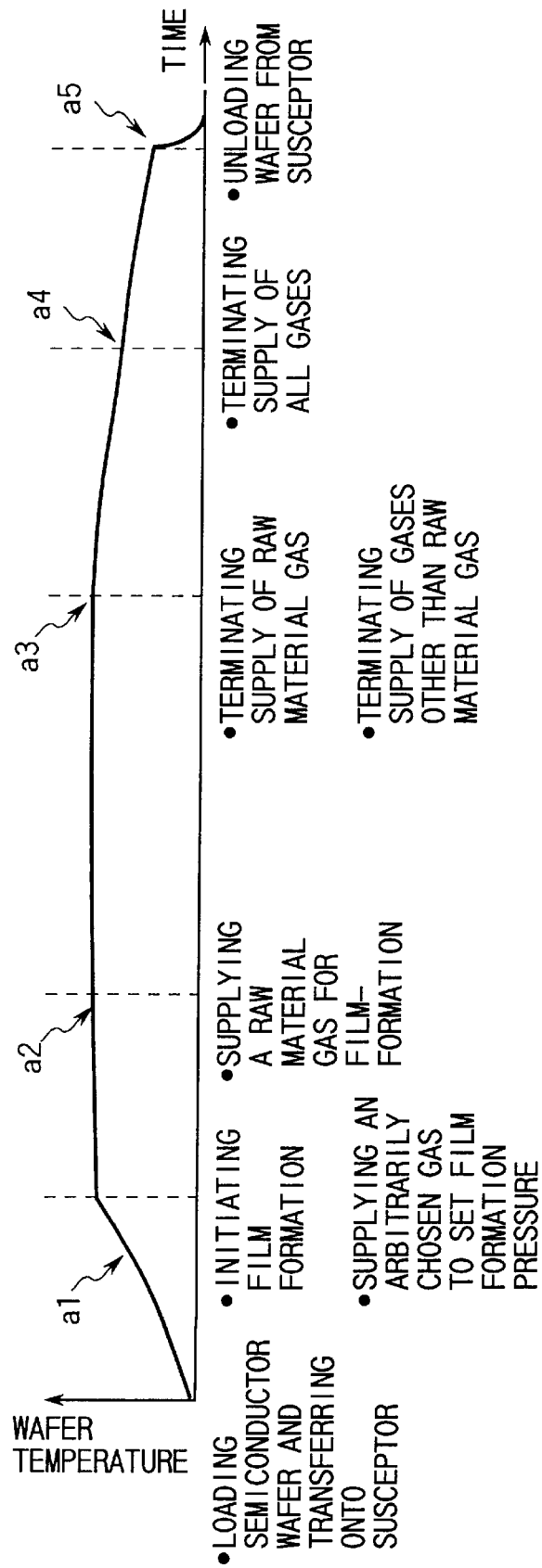
FIG. 3A is a graph showing a temperature change of a semiconductor wafer placed in a process chamber during a CVD film-formation process of the present invention.
Figure 3B:
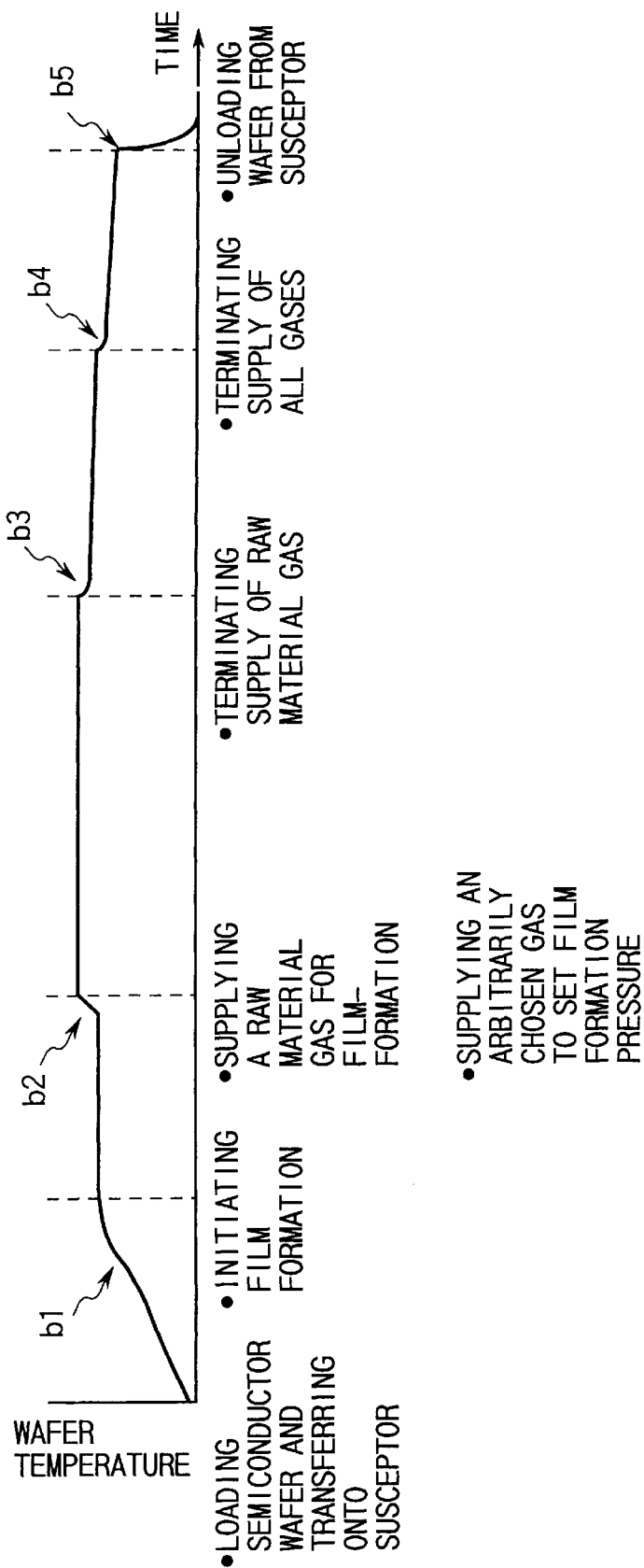
FIG. 3B is a graph showing a temperature change of a semiconductor wafer placed in a process chamber during a CVD film-formation process conventionally employed.

Now, we will explain the temperature change of the semiconductor wafer W in the course of the film formation process of the embodiment. The characteristic profile of temperature change in this embodiment (shown in FIG. 3A) is compared to that of a conventional case (FIG. 3B).

The stress is applied to the semiconductor wafer W when a rapid change occurs in temperature. The rapid temperature change occurs at the time the temperatures of the chambers are set differently and at the time the inner pressure of the chamber drastically changes. For example, at the time the semiconductor wafer W is heated after it is mounted on the susceptor 2 and before the film-formation step, at the time the supply of the raw material gas into a chamber is initiated or terminated, at the time the semiconductor wafer is unloaded from the process chamber, the rapid temperature change is likely to occur in the chamber or the semiconductor wafer.

As indicated by an arrow a1 (present invention shown in FIG. 3A) and an arrow b1 (conventional case shown in FIG. 3B), in the step of heating the semiconductor wafer W by the susceptor 2 after loaded into the process chamber 1, the semiconductor wafer W is more rapidly heated in the conventional method than in the present invention.

In this embodiment, after the semiconductor wafer W is loaded into the process chamber 1 and before it is mounted on the susceptor 2, the semiconductor wafer W is slowly heated by heat radiation from the heater 5 of the susceptor 2 while it is placed on the supporting pins 31. As a result, the temperature of the semiconductor wafer W increases to an appropriate temperature. The resultant semiconductor wafer is mounted on the susceptor 2 by descending the supporting pins 31 and then heated to a temperature (e.g., 450 to 600° C.) determined in accordance with film-formation conditions. In this way, the semiconductor wafer is heated more slowly compared to the conventional film formation process.

In this embodiment, before the raw material gas is introduced into the process chamber 1, arbitrarily chosen gases are introduced at the time indicated by an arrow a2 (FIG. 3A), thereby adjusting the pressure to a predetermined value determined in accordance with film-formation conditions.

No pressure change occurs when the raw material is introduced, with the result that no temperature change occurs.

Whereas, in the conventional film-formation process, the film formation pressure is adjusted by introducing a raw material gas into the chamber as indicated by an arrow b2 (FIG. 3B). As a result, the pressure change occurs resulting in a rapid temperature change.

In this embodiment, the film formation step is terminated by terminating the supply of the raw material gas at the time point indicated by an arrow a3 (FIG. 3A), followed by slowly terminating the supply of gases other than the raw material gas. The supply of all gases is stopped at the time point indicated by an arrow a4. Therefore, rapid pressure change is rarely resulted. However, in the conventional film-formation process, since the supply of other gases is stopped at the time point b4 after the supply of the raw material gas is terminated at the time point b4, a rapid change in pressure occurs. Consequently, a rapid temperature change takes place.

Next, we will explain the temperature change of the semiconductor wafer W caused by the wafer transportation during the film-formation process of this embodiment.

Figure 4A:
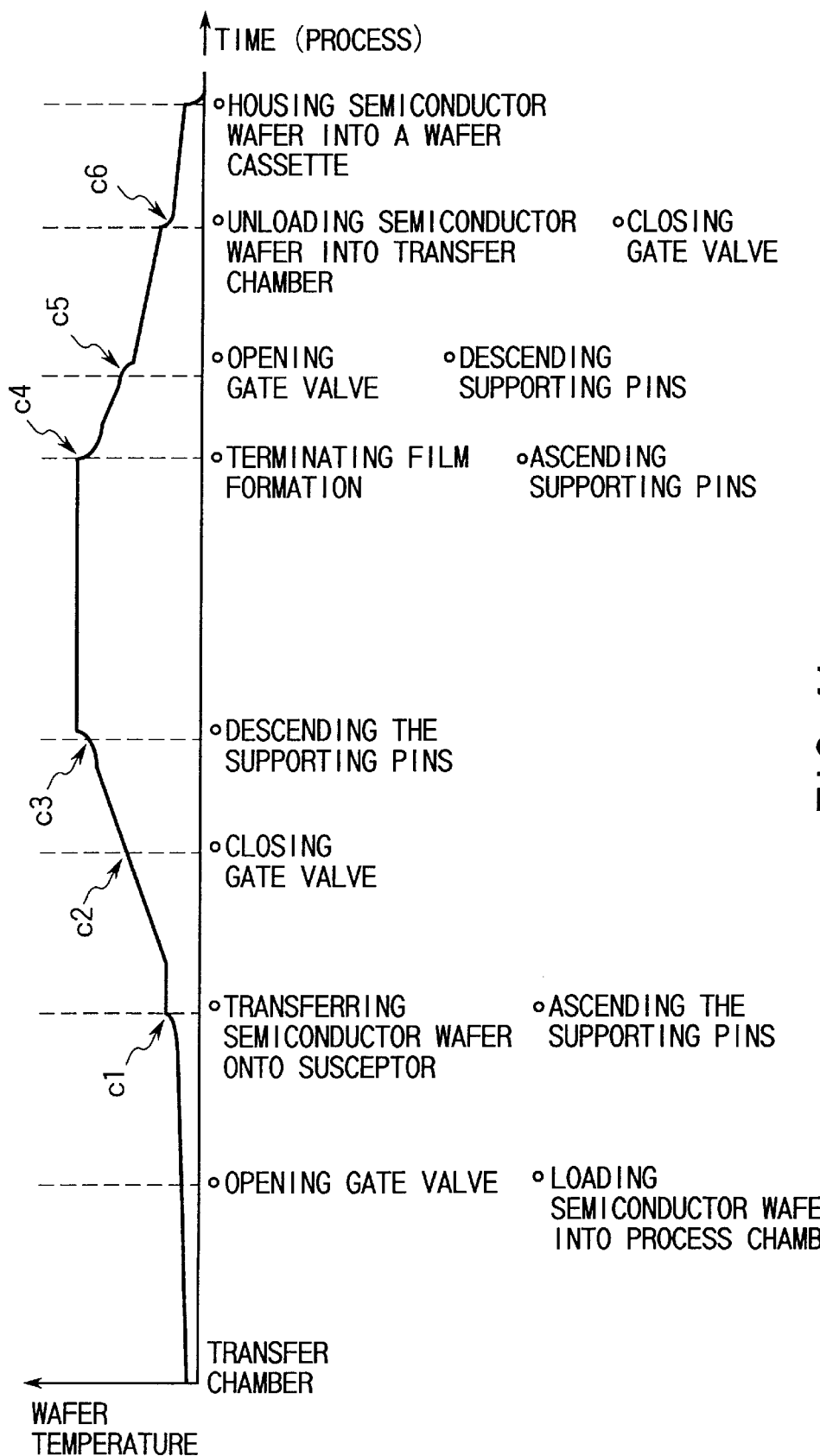
FIG. 4A is a graph showing a temperature change of a semiconductor wafer at the time a semiconductor wafer is loaded and unloaded into and from a process chamber in accordance with the CVD film formation method of the present invention.
Figure 4B:
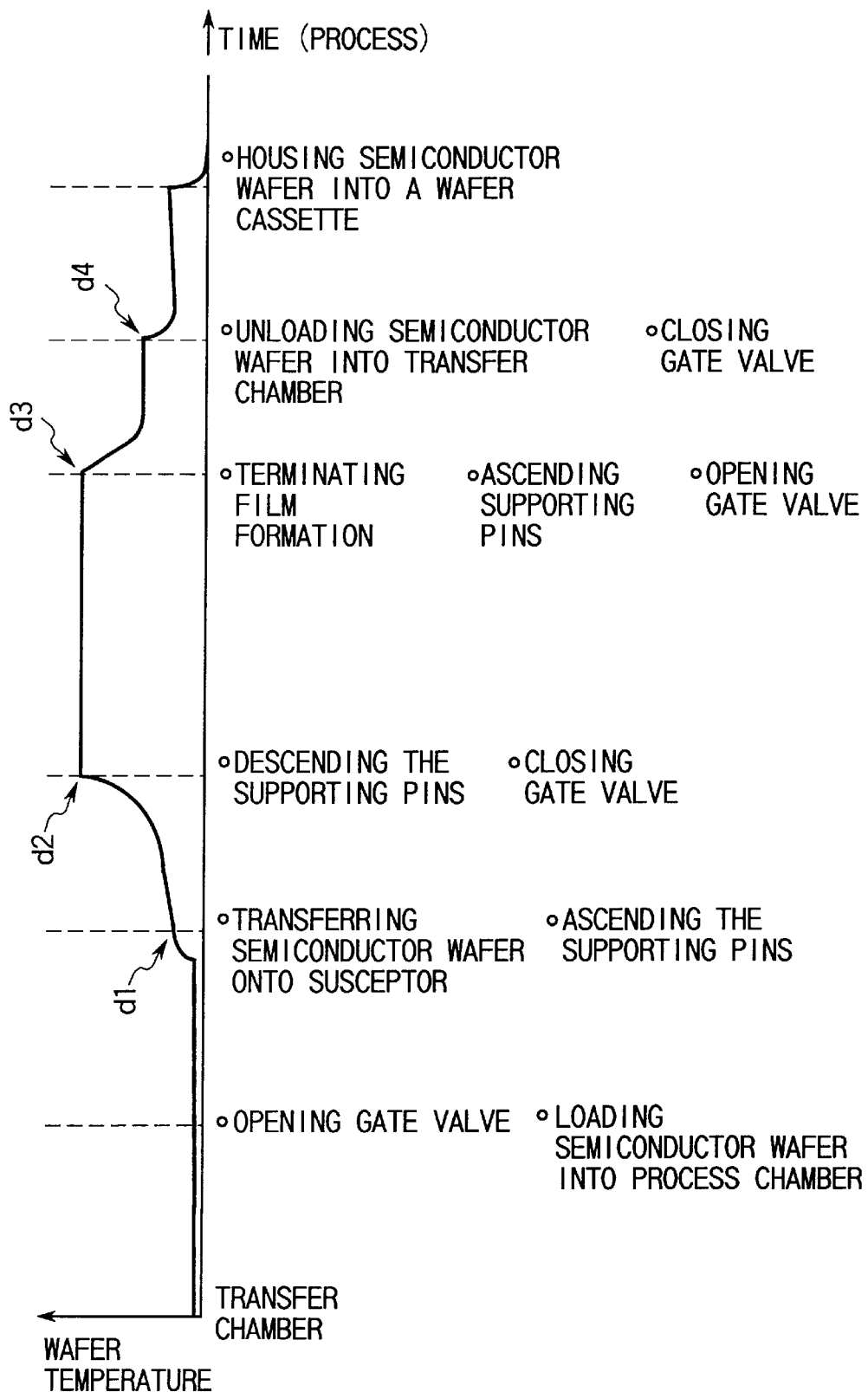
FIG. 4B is a graph showing a temperature change of a semiconductor wafer at the time a semiconductor wafer is loaded and unloaded into and from a process chamber in accordance with a CVD film formation method conventionally employed.

The characteristic profile of temperature change caused by the semiconductor wafer transportation in the present invention (shown in FIG. 4A) is compared to that of a conventional case (shown in FIG. 4B).

As shown in FIG. 4A, the semiconductor wafer W is loaded into the process chamber 1 from the transfer chamber 30 by the wafer transfer mechanism and then transferred onto the supporting pins 31 by lifting them (at the point indicated by c1). While the semiconductor wafer is placed on the supporting pins 31, a gate valve V is closed (arrow c2). Thereafter, the semiconductor wafer W is mounted on the susceptor 2 by descending supporting pins 31 (arrow c3).

As mentioned, since the semiconductor wafer W is placed on the supporting pins 31 for a predetermined time before the gate valve V is closed, a low-temperature semiconductor wafer W can be heated with heat radiation from the heater 5 of the susceptor 2. As a result, the temperature of the semiconductor wafer W is increased to some extent (arrows c1 to c3). Hence, rapid temperature change can be prevented after the semiconductor wafer 1 is placed on the susceptor 2 by descending the supporting pins 31.

In contrast, in the conventional film-formation process, the semiconductor wafer W is loaded from the transfer chamber 30 by the wafer transportation mechanism after the gate valve is opened, transferred onto the supporting pins 31 by moving them up (indicated by an arrow d1), and mounted on the susceptor 2 by immediately descending the supporting pins 31. Note that the gate valve V (indicated by an arrow d2) is closed simultaneously upon the wafer mounting. Accordingly, the low-temperature semiconductor wafer W is heated by the heater 5 of the susceptor in a short time upon mounting on the susceptor 2. As a result, the semiconductor wafer is rapidly increased in temperature.

After completion of the film formation process of this embodiment, the semiconductor wafer W is lifted by the supporting pins 31, and maintained as it is (shown by an arrow c4) for a predetermined time. After that, the gate valve V is opened. Then, the wafer transporting mechanism is inserted in the process chamber 1 to transfer the semiconductor wafer W to the wafer transporting mechanism by descending the supporting pins 31 (arrow c5). After the wafer transporting mechanism is moved backwards into the transfer chamber 30, the gate valve V is closed (arrow c6).

After completion of the film-formation process, the semiconductor wafer 1 is moved away from the susceptor 2 by moving up the supporting pins 31 and then direct heating is stopped. After the wafer is maintained as it is for a predetermined time, the gate valve V is opened. This means that the temperature of the semiconductor wafer is reduced to some extent during this step. Therefore, when the semiconductor wafer W is moved back into the transfer chamber 30 by the wafer transfer mechanism, the semiconductor wafer is prevented from being cooled rapidly in a low temperature atmosphere of the transfer chamber 30.

In contrast, in the conventional film-formation process, after the film formation process is completed, the semiconductor wafer is moved up by means of the supporting pins 31, at the same time, a gate valve V is opened, as shown in FIG. 4B (arrow d3). Then, the wafer transfer mechanism is allowed to enter into the process chamber 1. The semiconductor wafer W is then transferred to the wafer transfer mechanism by moving down the supporting pins 31. The wafer transporting mechanism is moved back into the transfer chamber 30 and the gate valve V is closed (arrow d4).

Since the semiconductor wafer W is unloaded by the wafer transporting mechanism after completion of the film-formation process, and moved into the transfer chamber 30, the wafer is rapidly cooled in the low temperature atmosphere of the transfer chamber 30.

As described in the foregoing, according to the film-formation process of this embodiment, it is possible to prevent a rapid temperature change when the semiconductor wafer is mounted on the susceptor, since the temperature of the semiconductor wafer is first increased by heat radiation from the heater to some extent while the semiconductor wafer is being lifted by the supporting pins for a predetermined time, and then the wafer is heated by the heater to the temperature required for the forming film step.

Subsequently, arbitrarily chosen gases are introduced to adjust the inner pressure of the process chamber 1 to a predetermined pressure required for the film-formation. Then, the raw material gas is supplied to start the film-formation on the semiconductor wafer. The film formation process is terminated by terminating only the raw material gas supply and gradually terminating supply of other gases. Hence, a significant pressure change does not occur, with the result that the atmosphere temperature in the process chamber is not rapidly reduced. As a result, the semiconductor wafer is not cooled rapidly.

When the semiconductor wafer W is unloaded from the process chamber 1 after completion of the film formation process, the semiconductor wafer is moved up by means of the supporting pins and maintained as it is for a predetermined time. In this manner, direct heating by means of the heater is terminated. After the temperature of the semiconductor wafer is decreased to some extent in this way, the wafer is unloaded from the process chamber by the wafer transporting mechanism. Hence, the semiconductor wafer is not cooled rapidly.

The thermal expansion coefficient of Si (a constituent of the semiconductor wafer) is $2.6 \times 10^{-6}/°$ C. and that of a TiN film is $7.1 \times 10^{-6}/°$ C. There is an extremely large difference in thermal expansion coefficient between them.

When a rapid temperature change occurs as in the conventional film-formation process, the semiconductor wafer experiences a large stress. However, if the rapid temperature change is prevented in the semiconductor wafer film-formation process as is in this embodiment, the stress applied to the semiconductor wafer can be reduced.

Note that the present invention is not limited to the aforementioned embodiment and may be modified in various ways.

Although the TiN film is formed in the aforementioned embodiment, the method of the present invention is effective in the case where metallic films such as a Ti film and an Al film are formed.

In general, the thermal expansion coefficient of the metallic material is larger than Si. For example, the thermal expansion of Ti is $9.95 \times 10^{-6}/°$ C. and those of Al and W are $2.55 \times 10^{-5}/°$ C. and $4.76 \times 10^{-6}/°$ C., respectively.

Since the thermal expansion coefficient of such a metal is considerably larger than that of Si, it is considered that a larger stress will be applied to the semiconductor wafer due to a temperature change. In this case, the present invention is particularly effective since it reduces stress significantly.

The present invention is particularly efficient in the case where a thin film is made of a metallic material such as a TiN, Ti, or Al. However, the present invention is not limited to this. The effect of the present invention can be obtained in the case where a film is formed of a material having a thermal expansion coefficient significantly different from that of the underlying substrate.

The embodiment has been explained by taking a semiconductor wafer as an example. However, the present invention is not limited to the semiconductor wafer. A glass substrate having other layer formed on a base substrate, may be employed.

As explained in the above, according to the CVD film formation method shown in this embodiment, rapid temperature change of the semiconductor wafer can be suppressed during the film formation process and the semiconductor wafer loading/unloading process. Therefore, it is possible to prevent stress from being applied rapidly to the semiconductor wafer, leading in prevention of cracks caused by crystal defect and distortion of the semiconductor wafer due to the stress.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a thin film on an object to be processed in a reduced process chamber by chemical Vapor Deposition (CVD), comprising the steps of:
   introducing arbitrarily chosen gases into the process chamber having an object to be processed loaded therein before a raw material gas is introduced, to set an inner pressure to a film-formation pressure determined in accordance with film-formation conditions;
   introducing a raw material gas for use in film formation into the process chamber;
   performing the film formation for a time determined in accordance with the film-formation conditions; and
   terminating only a raw material gas supply, followed by terminating supply of the arbitrarily chosen gases while flow rates thereof are gradually reduced, after completion of film formation process, thereby preventing a rapid pressure change of the process chamber and preventing a rapid temperature change of the semiconductor substrate due to the rapid pressure change.

2. A method of forming a thin film on an object to be processed placed in a reduced process chamber by a CVD (Chemical Vapor Deposition) while heating the object to be processed mounted on a susceptor by a heater housed in the susceptor, which comprises the steps of:
   loading the object to be processed into the process chamber;
   placing an object to be processed near the susceptor to heat the object to be processed with heat radiation from the heater for a first period of time before the object to be processed is directly heated;
   mounting the object to be processed onto the susceptor and heating the object to be processed by the heater;
   forming a film on the object to be processed by CVD;
   moving the object to be processed away from the heater and placing the object to be processed near the heater for a second period of time to reduce temperature of the object to be processed; and
   unloading the object to be processed from the process chamber, thereby preventing a rapid temperature change of the object to be processed.

3. The method of forming a thin film by CVD according to claim 1, wherein said thin film is a metal film selected from the group consisting of a TiN film, a Ti film and an Al film.

4. The method of forming a thin film by CVD according to claim 1, wherein said thin film is a metal film made of a material having a thermal expansion coefficient significantly different from that of the object to be processed.

5. The method of forming a thin film by CVD according to claim 1, wherein said object to be processed is either a semiconductor substrate made of silicon or a heat resistant substrate having a device formation layer made of a semiconductor.

6. The method of forming a thin film by CVD according to claim 2, wherein said object to be processed is loaded into the process chamber from the outside, received by a liftable supporting pins, placed away from the susceptor to heat the object to be processed by radiation from the heater for a predetermined time, mounted on the susceptor by descending the supporting pins, and heated to the film-formation temperature defined by the film-formation conditions.

7. The method of forming a thin film by CVD according to claim 2, wherein, after completion of the film formation process, the object to be processed mounted on the supporting pins is moved away from the susceptor by ascending the supporting pins, and maintained as it is for a time to reduce temperature of the object to be processed.

8. A method of forming a thin film by CVD performed in a CVD chamber which comprises
   a transfer chamber having a transporting mechanism for transporting an object to be processed;
   a process chamber for forming the thin film on the object to be processed by CVD by introducing a plurality of gases including a raw material gas into a reduced atmosphere, said process chamber having a susceptor for mounting the object to be processed by transferring it from the transporting mechanism with the help of the supporting pins and said process chamber having a heater to heat the object to be processed;
   a gate valve connected airtight to both the transfer chamber and the process chamber, for passing the transfer mechanism therethrough; and
   an exhausting system for reducing the pressures of the process chamber and the transfer chamber to a desired pressure, said CVD film-formation method comprises the steps of:

transporting the object to be processed by the transporting mechanism from the transfer chamber to the supporting pins which has been moved upward in the process chamber, closing the gate valve while the object to be processed held by the supporting pins is being heated, mounting, after a time, the object to be processed on the susceptor by descending the supporting pins;

heating the object to be processed to a film-formation temperature determined in accordance with film formation conditions;

introducing a plurality of gases except the raw material gas into the process chamber to obtain an atmosphere having a pressure determined in accordance with the film-formation conditions;

introducing the raw material gas into the atmosphere and forming a film on the object to be processed by CVD;

terminating CVD film formation by terminating only the raw material supply and moving up the supporting pins to keep the object to be processed away from the susceptor;

gradually reducing supply amounts of other gases introduced into the process chamber after the supporting pins are moved up, thereby suppressing a rapid pressure change happened immediately after termination of gas supply; and opening the gate valve and moving down the supporting pins, transferring the object to be processed to the transporting mechanism which has been loaded into the process chamber; and unloading the object to be processed from the process chamber.

9. The method of forming a thin film by CVD according to claim 2, wherein said first period of time is between 1 second and 60 seconds and said second period of time is between 1 second and 60 seconds.

10. The method of forming a thin film by CVD according to claim 2, wherein said first period of time is between 2 seconds and 10 seconds and said second period of time is between 2 seconds and 10 seconds.

\* \* \* \* \*